United States Patent
Banachowicz et al.

(10) Patent No.: US 7,277,309 B1
(45) Date of Patent: Oct. 2, 2007

(54) INTERLOCKING MEMORY/LOGIC CELL LAYOUT AND METHOD OF MANUFACTURE

(75) Inventors: Bartosz Banachowicz, Santa Clara, CA (US); Andrew Wright, Fremont, CA (US)

(73) Assignee: NetLogic Microsystems, Inc., Mountain View, CA (US)

( * ) Notice: Subject to any disclaimer, the term of this patent is extended or adjusted under 35 U.S.C. 154(b) by 0 days.

(21) Appl. No.: 11/585,460

(22) Filed: Oct. 23, 2006

Related U.S. Application Data

(62) Division of application No. 11/090,116, filed on Mar. 24, 2005, now Pat. No. 7,126,837.

(60) Provisional application No. 60/556,628, filed on Mar. 26, 2004.

(51) Int. Cl.
*G11C 15/00* (2006.01)

(52) U.S. Cl. .............................. 365/49; 365/69; 365/72

(58) Field of Classification Search ................. 711/108
See application file for complete search history.

(56) References Cited

U.S. PATENT DOCUMENTS

| 6,370,052 B1 * | 4/2002 | Hsu et al. ..................... 365/49 |
| 6,704,216 B1 * | 3/2004 | Cheng et al. ................. 365/49 |

* cited by examiner

*Primary Examiner*—Tan T. Nguyen
(74) *Attorney, Agent, or Firm*—Haverstock & Owens LLP

(57) ABSTRACT

A memory/logic cell layout structure includes a pair of memory/logic cells formed on a substrate. Each memory/logic cell (102, 104) can include a pair of memory areas to store data (106-0/106-1, 106-2/106-3), and a logic portion (108-0, 108-1) that receives the data stored therein. Memory areas and the logic portions of each memory/logic cell can be arranged on the substrate in a shape of an L, U, S, T, or Z to form a pair of interlocking memory/logic cells.

13 Claims, 13 Drawing Sheets

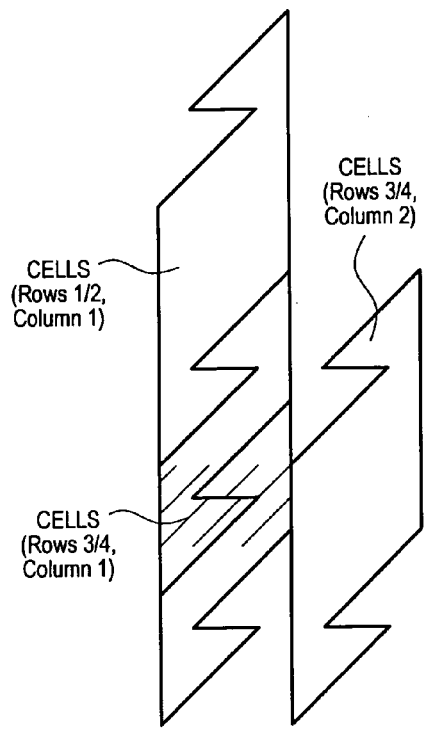
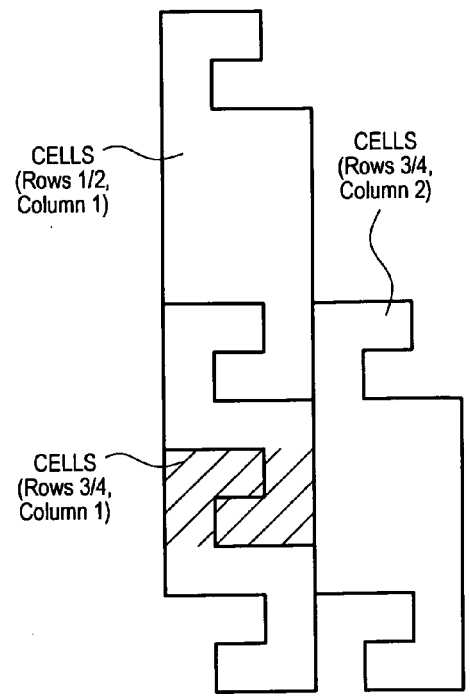
FIG. 8E
FIG. 8F
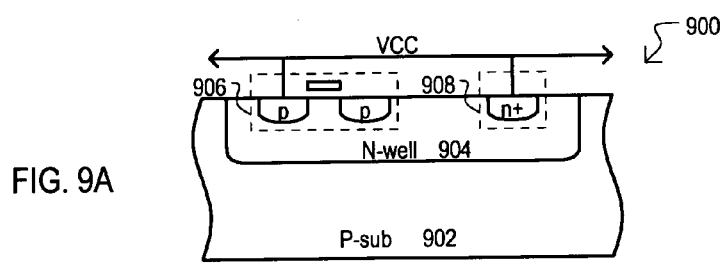
FIG. 9A
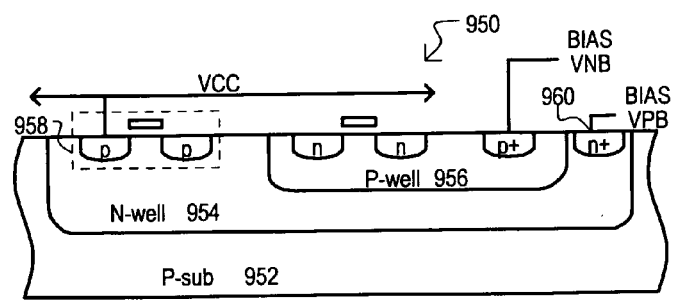
FIG. 9B

INTERLOCKING MEMORY/LOGIC CELL LAYOUT AND METHOD OF MANUFACTURE

This application claims the benefit of U.S. Provisional Patent Application Ser. No. 60/556,628 filed on Mar. 26, 2004 and is a divisional of U.S. patent application Ser. No. 11/090,116 filed on Mar. 24, 2005 now U.S. Pat. No. 7,126,837.

TECHNICAL FIELD

The present invention relates generally to processes for fabricating integrated circuit (IC) devices, and more particularly to IC devices utilizing memory circuits in conjunction with logic circuits and methods for making the same.

BACKGROUND OF THE INVENTION

Integrated circuit devices can include arrangements in which memory elements are utilized in conjunction with logic elements. For example, content addressable memory (CAM) devices can include CAM cells having one or more storage circuits that operate in conjunction with compare logic for determining whether one or more bits stored in the CAM cell match one or more compare data bits. Along these same lines, programmable logic devices can include storage circuits that store configuration information that can establish the functionality of corresponding logic circuit.

CAM devices can allow for a simultaneous search access to each entry stored in an associative memory cell array. Built-in compare circuitry within a CAM device can compare a specific pattern of bits, commonly known as a search key or comparand or compare data, against a large number of bit patterns stored in the associative memory cell array. Thus, an entire associative memory cell array can be searched essentially in parallel. Because of this parallel search capability, CAM devices are used in a growing number of applications, such as in network search engines (NSEs). NSEs can use CAMs to provide fast searches of a database, list, or pattern.

Typically, a memory cell array of a CAM device can be built from a large number of single CAM cells. A layout for a prior art single ternary CAM (TCAM) cell is shown in FIG. 11 and designated by the general reference character 1100. Generally, the conventional single TCAM cell can include a "stack" 1102 containing compare circuitry that is physically situated between two static random access memory (SRAM) cells (1104 and 1106). Each of the SRAM cells (1104 and 1106) can store bits of data (called X-value and Y-value). Such an X and Y value can be compared by transistors in the stack 1102 against external comparand data supplied to the TCAM cell via inputs. Such compare data is commonly labelled as compare data (CD) and an inverse compare data, or compare data "bar" (CDB). A stack 1102 can consist of four to six metal oxide semiconductor (MOS) transistors (in the example shown, n-channel transistors) placed adjacent to SRAM cells (1104 and 1106).

A conventional TCAM device, like that described above, can suffer from a number of problems, the most notable being a size limitation. Common TCAM applications can require a large depth or size in the number of entries (data) that may be formed in an array of memory cells. However, for a given TCAM memory cell array size, as width of the array (or the number of bits in each entry) increases, depth (or number of entries) can decrease correspondingly. Thus, to increase capacity of a memory cell array there is a need to increase the number of individual TCAM cells that can be formed in a single TCAM device. However, because each individual conventional TCAM cell can require a relatively large area on the substrate or die on which the TCAM device is formed, there is a relatively low limit to the size of a TCAM array, or number of TCAM cells, that can be implemented in a single TCAM device.

Accordingly, there is a need for some way of increasing the number of cells that may be included in memory cell array. For example, it would be desirable to arrive at a more compact layout that can reduce the area occupied by a memory/logic CAM cell on a die or substrate. It would also be desirable if such an approach was compatible with both "tapped" well and body bias approaches, in the event such a device is implemented in complementary device technology (e.g., CMOS).

SUMMARY OF THE INVENTION

The present invention can provide a solution to these and other problems, and offers further advantages over conventional memory/logic cell device, such as Ternary Content Addressable Memory (TCAM) devices, as but one example.

In one aspect, the present invention is directed to a memory/logic cell layout structure for a memory device including first and second memory/logic cells formed on a surface of a substrate. Generally, each memory/logic cell can include a pair of memory areas to store data and a logic circuit that receives data stored in the pair of memory areas. The first memory/logic cell and second memory/logic cell can each be bounded by a layout area, and can be interlocked with one another having areas that share at least two sides with one another According to one aspect of the embodiments, the memory areas of each memory/logic cell can include static random access (SRAM) memory cells.

According to another aspect of the embodiments, the pair of memory areas and the logic circuit of each memory/logic cell can be arranged on the surface of the substrate. The memory areas and logic circuit of each memory/logic cell can generally have an "L" shape, a "U" shape, an "S" shape, a "T" shape, or a "Z" shape. In one particular arrangement, the first and second memory/logic cells can have substantially identical L-shaped layouts with respect to a predetermined set of layers. In one example, such a set of layers can include each layer up to and including a second interconnect layer. The memory/logic cells can be interlocked with one memory/logic cell layout being rotated by 180 degrees relative to the other memory/logic cell layout.

According to another aspect of the embodiments, each memory/logic cell can include a CAM cell that can selectively couple a corresponding match line to a pseudo-supply node in a compare operation. A pseudo-supply node can be preset to one potential prior to a compare operation, and allowed to float during a compare operation. A pseudo-supply node of a first CAM cell can be connected to a pass transistor of a memory cell in a second CAM cell.

According to another aspect of the embodiments, each memory area can include a static random access memory (SRAM) cell with a double word line architecture. In such an architecture, each memory area can include a first word line connected to a first pass transistor of each SRAM cell and a second word line connected to a second pass transistor of each SRAM cell.

According to another aspect of the embodiments, first and second memory/logic cells can share parallel blocks, including at least one region of a first conductivity type and at least one region of a second conductivity type. Such parallel blocks can be crossed by word lines of a pair of memory cells. The word lines can be essentially perpendicular to the parallel blocks. In one particular arrangement, the parallel blocks can include two P-type regions formed by a P-type substrate and one N-type region between the two P-type regions, formed by an N-well situated within the P-type substrate. In another arrangement, parallel blocks can include one N-type region formed by an N-well situated within a P-type substrate. P-type regions can be situated on both sides of the N-type region by forming by P-wells within the N-well.

According to another aspect of the embodiments, the memory/logic cells can be CAM cells, each with at least one memory cell and one logic circuit. Each logic circuit can include a compare circuit having a vertical stack architecture with a plurality of transistors physically arranged in series between one memory cell of the CAM cell containing the compare circuit and one of the memory cells of the other CAM cell. In one arrangement, the transistors of the vertical stack include N-channel insulated gate field effect transistors having source-drain paths electrically connected in series. In another arrangement, the transistors of the vertical stack can include p-channel insulated gate field effect transistors having source-drain paths electrically connected in series. In yet another arrangement, the transistors of the vertical stack can include a mix of both n-channel and p-channel transistors having source-drain paths connected in series.

According to another aspect of the embodiments, each compare circuit can include two internal stack transistors with gates coupled to internal nodes of the pair of memory cells, and further include two stack transistors with gates coupled to a compare data (CD) and inverse compare data (CDB) inputs.

According to another aspect of the embodiments, a pair of memory/logic cells can be CAM cells can be arranged on the surface of the substrate such that they are mirrored in the direction of word lines of the CAM cells for a predetermined set of manufacturing layers, including a transistor gate layer and first interconnect layer.

According to another aspect of the embodiments, pairs of memory/logic cells can be CAM cells repeated in a step wise fashion in the direction of bit lines common to the pairs of CAM cells and with bit line contacts being shared by CAM cell pairs. In an even more particular arrangement, pairs of memory/logic cells can be mirrored in such a direction.

According to another aspect of the embodiments, a memory cell layout with interlocking first and second TCAM cells, as described above, can be repeated in a row and column direction to form a memory cell array of a semiconductor memory device. The present invention can also include a method of forming a memory device on a substrate having ternary content addressable memory (TCAM) cells. The method can include, for each of a plurality of TCAM cells, forming an identical layout for memory cells and a compare section of each TCAM cell. The method can also include forming at least a first and second TCAM cell in a substrate according to the layout in interlocking positions, such that the TCAM cells share at least two sides with one another.

According to another aspect of the embodiments, the shape of the TCAM cells can generally include an "L" shape, a "U" shape, an "S" shape, a "T" shape, or a "Z" shape.

According to another aspect of the embodiments, forming the first and second TCAM cells in the substrate can include orienting a second TCAM cell with a 180 degree rotation with respect to an adjacent first TCAM cell, to form an interlocking TCAM cell pair that includes the first and second TCAM cells.

According to another aspect of the embodiments, a method can further include forming a compare section in each TCAM cell that provides a controllable impedance path between a match line and a pseudo-supply node. In addition, the method can include forming a conductive connection between a pass transistor of a memory cell in the first TCAM cell and the pseudo-supply node of the second TCAM cell.

The present invention can also include a configuration for CAM cells that includes a first CAM cell having at least a first memory cell with a pass transistor. The first CAM cell also includes a first compare section coupled between a first pseudo-supply node, that is selectively isolated from a power supply, and a first match line. A second CAM cell can have a second memory cell with a pass transistor and a second compare section coupled between a second pseudo-supply node, that is selectively isolated from the power supply, and a second match line. A pass transistor of the first memory cell can be coupled to the second pseudo-supply node.

According to one aspect of the embodiments, the first and second compare sections can each include a plurality of transistors physically arranged in series with one another to form a stack.

BRIEF DESCRIPTION OF THE DRAWINGS

Various features and advantages of the present invention will be apparent upon reading of the following detailed description in conjunction with the accompanying drawings and the appended claims provided below, where:

FIGS. 8A to 8F show examples different possible shapes for interlocking memory/logic cells according to various embodiments;

FIGS. 9A and 9B shows examples of different N-well biasing schemes for TCAM cells according to an embodiment;

DETAILED DESCRIPTION

The present invention is directed to a novel layout for a circuit that employs memory circuits in conjunction with corresponding logic circuits, including but not limited to programmable logic (PLD) circuits and/or content addressable memory (CAM) devices, including both ternary CAM (TCAM) devices, "pseudo" TCAM devices, and binary CAM devices. The disclosed layouts can include a pair of memory/logic cells that can occupy less area on a die or substrate on which they are formed over conventional approaches.

A layout structure according to one embodiment of the present invention will now be described with reference to FIG. 1. For purposes of clarity, many of the details of particular memory/logic cells and the methods of designing and manufacturing the same that are widely known and are not relevant to the present invention have been omitted from the following description.

Figure 1:
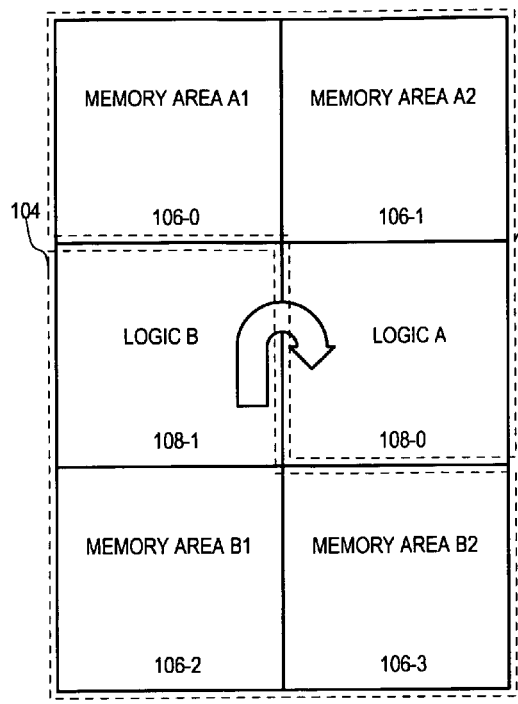
FIG. 1 is a block diagram of a pair of interlocking memory/logic cells according to an embodiment of the present invention.

FIG. 1 is a block diagram of a pair of interlocking memory/logic cells showing an embodiment of a unique layout structure or layout according to the present invention. The layout structure is designated by the general reference character 100 and can include a first memory/logic cell 102 and second memory/logic cell 104 that can be interlocked with one another. Such memory/logic cells can be considered interlocked, in that that one memory/logic cell may abut the other one on more than one side.

Generally, each memory/logic cell (102 and 104) can include a pair of memory areas (106-0/106-1 or 106-2/106-3) and a logic portion (108-0 or 108-1) arranged on a surface of a substrate. The individual memory/logic cells (102 and 104) can have substantially identical L-shapes. Further, the pair of memory/logic cells (102 and 104) can be interlocked by rotating a layout of one of memory/logic cells by 180 degrees relative to the other memory/logic cell. This is represented by the arrow in FIG. 1.

Together, each memory section (106-0 to 106-3) can store one or more bit values that can determine the operation of the corresponding logic portion (108-0 and 108-1).

In one very particular PLD embodiment, memory sections 106-0 and 106-1 can store one or more configuration bits that establish the functionality of logic portion 108-0. Similarly, memory sections 106-2 and 106-3 can store one or more configuration bits that establish the functionality of logic portion 108-1.

In a particular binary CAM or pseudo TCAM embodiment, memory sections 106-0 and 106-1 can store a data bit value V. Such a data bit value V can be compared to a corresponding compare data bit value by compare circuits within logic portion 108-0. Memory sections 106-2 and 106-3 can store another data bit value that can be compared to a corresponding compare data bit value by compare circuits within logic portion 108-1 (with global masking capabilities along a column direction in the pseudo TCAM case).

In a particular TCAM embodiment, memory sections 106-0/106-1 and memory sections 106-2/106-3 can store two values (e.g., V/M or X/Y). Such two values can be compared by transistors within a corresponding logic portion (108-0 or 108-1) to compare data (CD and/or CDB) supplied to the TCAM cells or otherwise used to provide a masked compare function.

Figure 11:
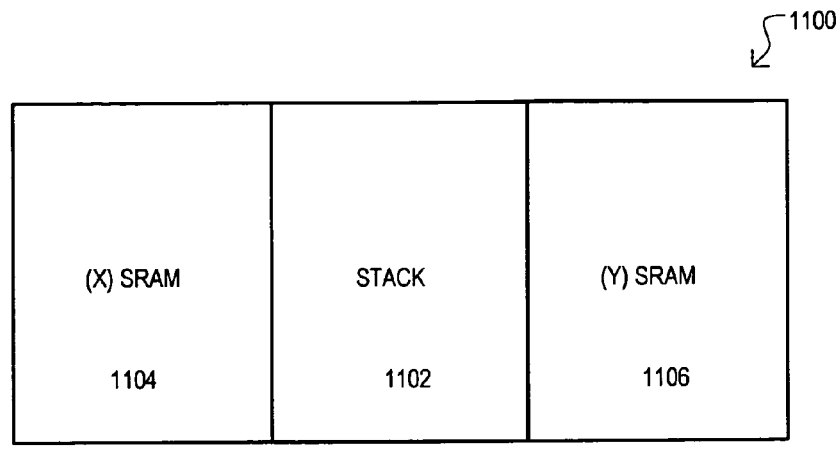
FIG. 11 is a block diagram of a prior art layout for a TCAM cell.

In this way, a layout structure 100 can form a repeatable structure composed of two interlocked memory/logic cells that can be repeated to form a compact memory/logic memory cell array. This can be sharp contrast to an approach like that of FIG. 11, in which single TCAM cell layouts, which are not interlocking, are repeated to form an array.

It is understood that when a memory/logic pair is repeated, this can include mirror-image type replications and/or non-mirror image replications, such as "tiling".

Referring now to FIGS. 2A to 3B, a second embodiment of the present invention is set forth in a top plan view. A second embodiment can include a layout structure that is designated by the general reference character 200. The embodiment of FIGS. 2A to 3B can be considered related to that of FIG. 1 in that the layout 200 can represent a more detailed example of one version of layout 100.

A layout structure 200 can include some of the same general structures as set forth in the first embodiment 100. Accordingly, like structures will be referred to by the same reference character, but with the first digit being a "2" instead of a "1".

Figure 2A:
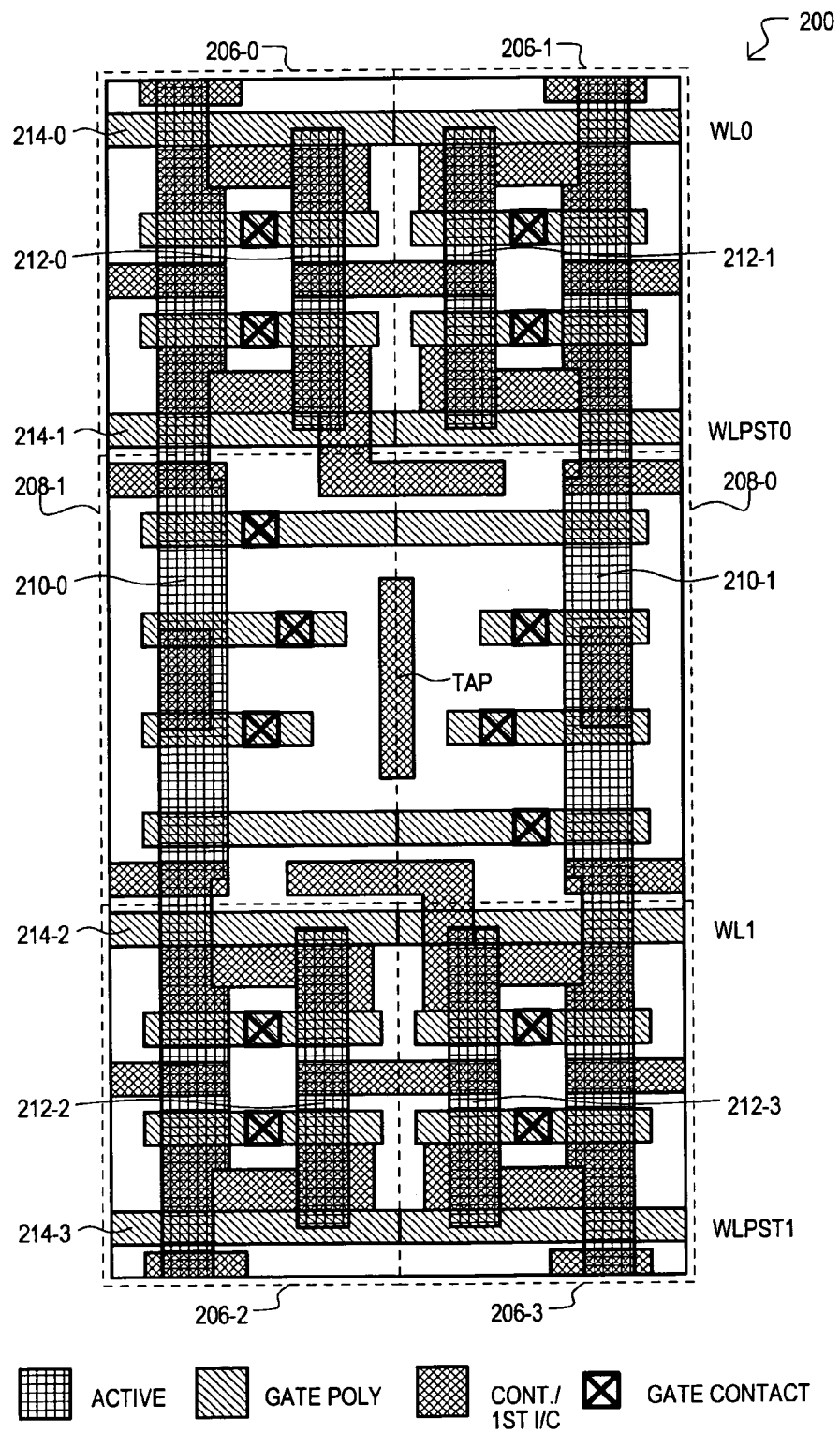
FIG. 2A shows the layout of active regions, gate structures, a first level local interconnect, and gate contact for interlocking TCAM cells according to an embodiment of the present invention.
Figure 2B:
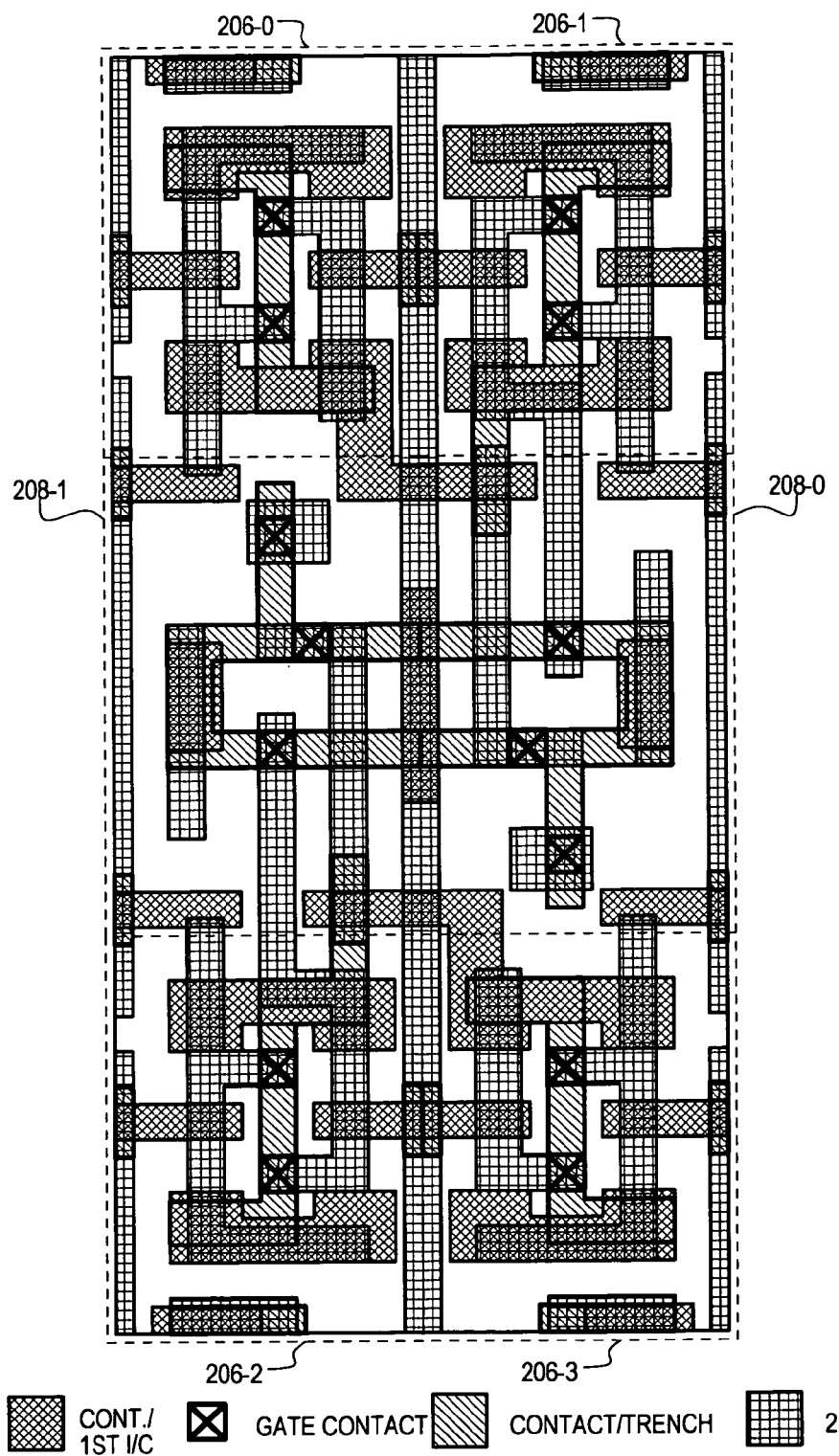
FIG. 2B shows contact/trench and second level local interconnect overlaid on the view of FIG. 2A.

FIG. 2A is a top plan view showing a layout of an active or diffusion region layer, a polysilicon gate layer, a first contact/interconnect layer, and contact locations to polysilicon gates. FIG. 2B represents the same view as FIG. 2A, showing the first contact/interconnect layer, a contact/trench layer, and a local interconnect layer.

FIGS. 2A and 2B also show resulting TCAM cell structures, include SRAM cell pairs (206-0/206-1 and 206-2/206-3) and stack portions (208-0 and 208-1) for each TCAM cell. More particularly, SRAM cell 206-0 can store an X-value for a first TCAM cell, SRAM cell 206-1 can store a Y-value for a first TCAM cell, and stack portion 208-0 can compare X and Y values from SRAM cells (206-0 and 206-1) with compare data values (e.g., CD and BCD). In a similar fashion, SRAM cell 206-2 can store an X-value for a second TCAM cell, SRAM cell 206-3 can store a Y-value for a second TCAM cell, and stack portion 208-1 can compare X and Y values from SRAM cells (206-2 and 206-2) with compare data values (e.g., CD and BCD).

Figure 3A:
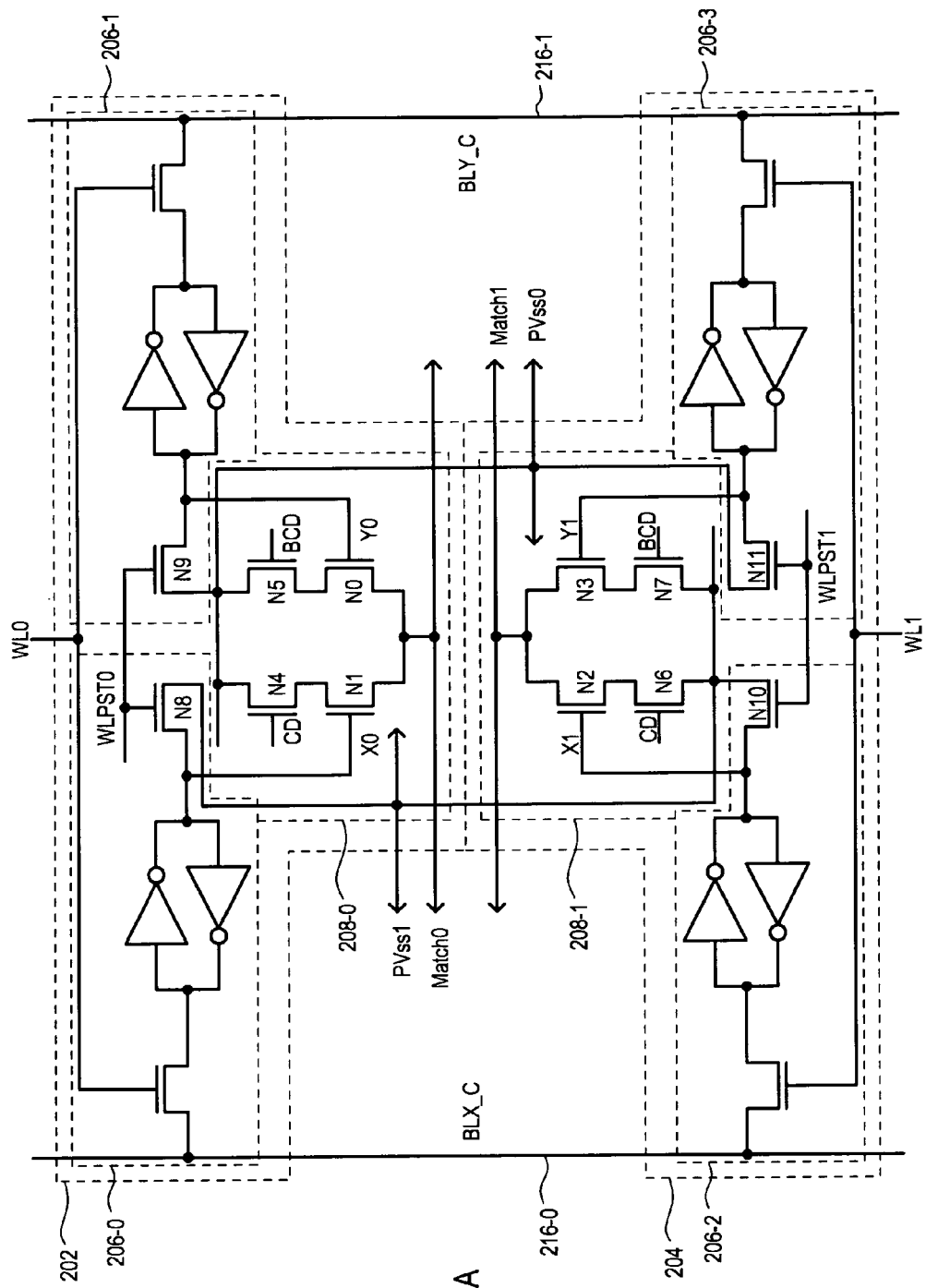
FIG. 3A is a schematic diagram of the interlocking TCAM cells of FIGS. 2A and 2B according to an embodiment of the present invention.

FIG. 3A is a schematic diagram of the interlocking TCAM cells of FIGS. 2A and 2B. The general structure of the interlocking TCAM cells will now be described in more detail.

Referring to FIGS. 2A through 3A, each SRAM cell (206-0 to 206-3) can be a double word line architecture cell, with parallel blocks, with one including first type active areas (210-0 and 210-1) for containing n-channel devices and another including second type active areas (212-0 to 212-3) for containing p-channel devices. In one particular arrangement, first type active areas (210-0 and 210-1) can be formed in a P-type substrate, while second type active areas (212-0/212-1 and/or 212-2/212-3) can be formed in an N-well that is formed within the P-type substrate.

However, in alternate arrangements, such diffusion regions can have a different configuration. As but one of the many possible examples, and as will be described in more detail below, second type active areas (212-0/212-1 and/or 212-2/212-3) can be formed in an N-well that is formed within the P-type substrate, while first type active areas (210-0 and 210-1) can be formed in P-wells formed within such N-wells (i.e., a triple well structure).

Word lines (214-0 to 214-3) can cross the diffusion blocks in a perpendicular direction. A word line direction will be referred to herein as an "X" direction, and a direction perpendicular to the X direction will be considered a "Y" direction.

As shown in FIGS. 2A and 2B, SRAM cells (206-0 to 206-3) can be arranged such that they are mirrored in X direction. That is, SRAM cells (206-0 to 206-3) can be mirrored in the direction of the word lines (e.g., 214-0 and 214-1). Adjacent SRAM cells can share a same high power supply connection (VCC), as will be described in more detail below.

Each stack portion (208-0 and 208-1) can have a "vertical" stack architecture with N-channel metal-oxide-semiconductor (MOS), or similar type, transistors formed within a diffusion block extending from at least one of the SRAM cells. For example, a diffusion block containing active area 210-0 can be conceptualized as extending from SRAM cell 206-0 and/or 206-2. In the particular arrangement shown in FIG. 2A, polysilicon gates within stack portions (208-0 and 208-1) can be perpendicular to such diffusion blocks.

In the very particular example of FIGS. 2A to 3B, gates of two internal stack transistors (e.g., N0/N1 or N2/N3) can be connected to internal nodes of corresponding SRAMs. Gates of a remaining two stack transistors (e.g., N4/N5 and N6/N7) can be connected to comparand external data inputs CD and CDB. However, other arrangements can include a different number of transistors depending upon the type of compare circuit employed. Thus, the particular stack circuitry shown in FIGS. 2A to 3B should not be construed as limiting to the present invention.

Figure 3B:
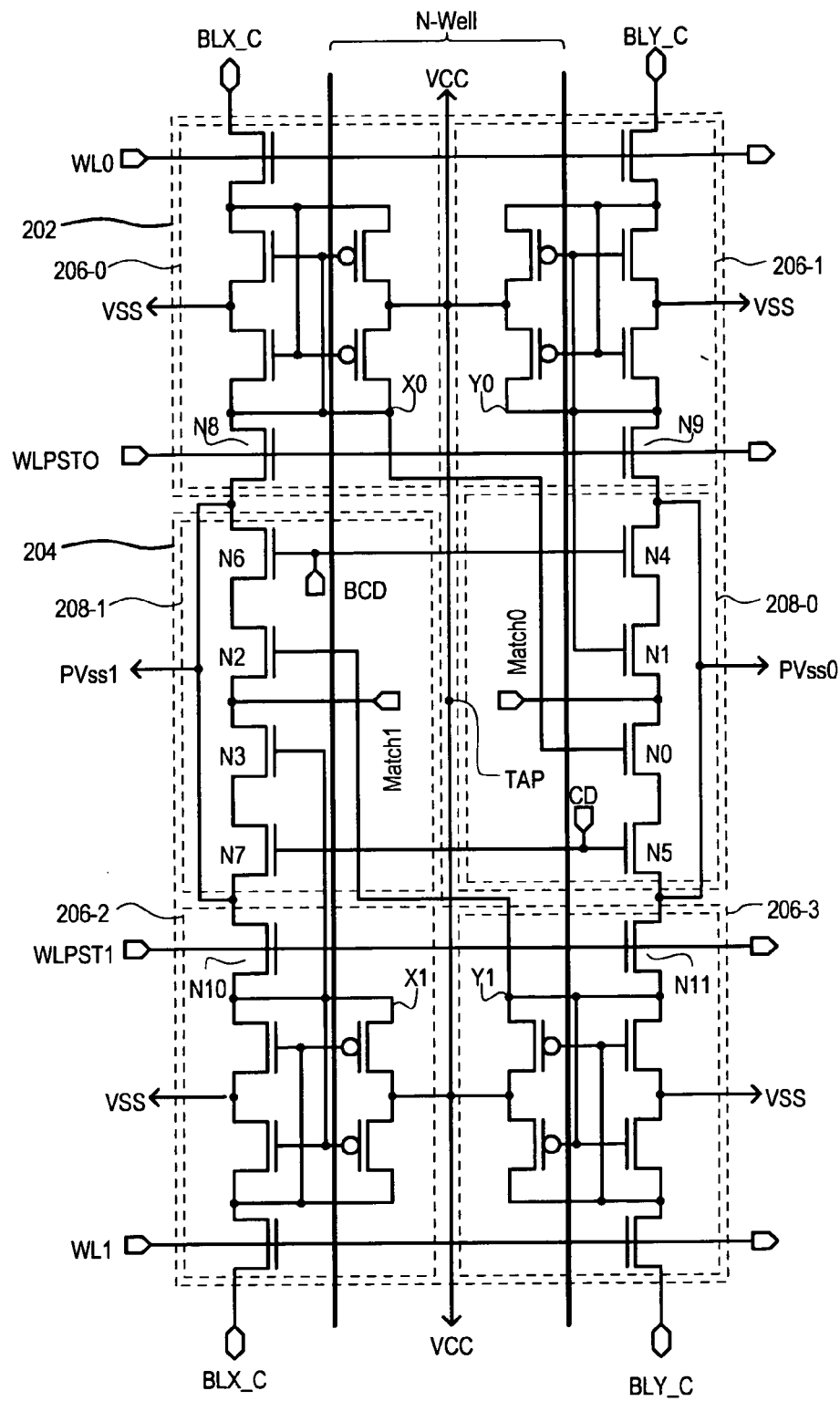
FIG. 3B is a schematic diagram of circuit components situated generally as in the layout of FIGS. 2A and 2B.

Referring now to FIG. 3B, a schematic diagram is shown with the circuitry of FIG. 3A projected into physical locations generally corresponding to the layout of FIGS. 2A and 2B. FIG. 3B shows the SRAM inverters of FIG. 3A implemented as CMOS type inverters, as well as the general location of an N-type well within a p-type substrate. However, as noted above, such an N-type well may contain p-type wells that hold all or part of the N-channel MOS transistors of the TCAM cells.

In the embodiment shown in FIGS. 2A to 3B, an N-well can be continuous and a tap can be present for every pair of TCAM cells. However, in an alternative embodiment, as described in more detail below, a tap can be removed, the interlocking TCAM cells arrangement being body bias compatible.

Referring to FIGS. 3A and 3B, the schematics show that a pair of interlocking TCAM cells can comprise thirty-two (32) transistors (24 NMOS type and 8 PMOS type). While the circuits shown in FIGS. 3A and 3B can be distinguished from other conventional approaches by numerous ways, including the novel layout arrangement. In addition, however, the schematics also show a unique manner of coupling a pseudo-Vss (PVss) supply to pass transistors (N8, N9, N10 and/or N11). In particular, a pass transistor of one TCAM cell in the pair can be connected to a PVss supply of the other TCAM cell of the pair.

Thus, in the arrangement of FIGS. 3A and 3B, pass transistor N8 of a first TCAM cell 202 can be connected to a PVss node (PVss1) of second TCAM cell 204. In the same fashion, pass transistor N11 of a second TCAM cell 204 can be connected to PVss0 node of first TCAM cell 202. It is noted that in the arrangement shown, a next pair of TCAM cells that would form another two rows in an array do not have connections to PVss nodes of a first row.

It is understood that a pseudo-Vss node can be a supply node that provides a low supply voltage for TCAM cell operations. However, such a supply is not a true supply (e.g., Vss) as a pseudo-Vss node is isolatable from a power supply. More particularly, a pseudo-Vss node can be precharged to a low supply voltage (Vss) prior to a compare operation (e.g., a precharge cycle), and then isolated from the supply voltage during a compare operation.

One particular approach to a pseudo-Vss TCAM architecture is disclosed in U.S. Pat. No. 6,515,884 B1, issued to Sywyk et al., on Feb. 4, 2003.

Having described a layout and schematic for a pair of interlocking TCAM cells, the operation of such a pair of interlocking TCAM cells according to an embodiment of the present invention will now be described in detail with reference to FIG. 3A. It will be appreciated that while the following description is applicable to the embodiment set forth in FIGS. 2A to 3B, such a description represents the operation of but one of many different types of TCAM cells that can be laid out in an interlocking fashion according to the present invention. Accordingly, a method and the layout of the present invention are not to be construed as being limited thereby.

Referring to FIG. 3A, a single TCAM cell (202 or 204) can be used to compare data stored (coded) in embedded SRAM cells (e.g., 206-0/206-1 or 206-2/206-3) against external compare data provided to compare transistors of compare portions (208-0 or 208-1). SRAM cells can be conceptualized as storing X and Y bit values. In one particular arrangement, the meaning (value) of such bit value pairs for comparison against the external data is set forth below.

When X=0 and Y=1, the value stored by the TCAM cell is "1". That is, in a compare operation, a "hit" can be generated when compare data (CD) is a "1" and inverse compare data (BCD) is a "0".

When X=1 and Y=0, the value stored by the TCAM cell is "0". That is, in a compare operation, a "hit" can be generated when CD is a "0" and BCD is a "1".

When X=0 and Y=0, the value stored by the TCAM cell is "Don't Care=Always Hit". That is, in a compare operation, a "hit" can be generated regardless of CD or BCD.

When X=1 and Y=1, the value stored by the TCAM cell is "Always Miss". That is, in a compare operation, a "miss" can be generated provided one of CD or BCD is high.

Data applied as CD/CDB can be either matched to the stored value (X/Y) (i.e., generate a hit) or unmatched (i.e., generate a miss).

Of course the above represents but one way in which a TCAM cell can operate. Alternate arrangements can include value/mask (V/M) TCAM compare operations. The meaning (value) of such bit value pairs for comparison against the external data is set forth below.

When M=0 and V=1, the value stored by the TCAM cell is "1". That is, in a compare operation, a "hit" can be generated when compare data (CD) is a "1" and inverse compare data (BCD) is a "0".

When M=0 and V=0, the value stored by the TCAM cell is "0". That is, in a compare operation, a "hit" can be generated when CD is a "0" and BCD is a "1".

When M=1, the value stored by the TCAM cell is "Don't Care=Always Hit". That is, in a compare operation, a "hit" can be generated regardless of CD or BCD.

Referring now back to the X/Y coding arrangement of FIG. 3A, when a value stored or coded in the SRAMs is equal to that applied to CD (and opposite to that applied to BCD), or is in a "don't care" state, a path between a corresponding match line (e.g., Match0 or Match1), which can be at a Vcc potential, and PVss node, can become a high impedance path. If all TCAM cells connected to the same match line have the same high impedance state, a "hit" can be generated, which can be detected by external circuitry to indicate a match.

When a value stored or coded in the SRAMs is not equal to that applied to CD (and opposite to that applied to BCD), then the path between a match line and a PVss node can become a low impedance path. A resulting change in potential can be detected by external circuitry indicating a miss, or an unmatched condition.

It will be appreciated that a TCAM cell of the embodiment of FIGS. 2A to 3B can operate to store data, write data to SRAM cells, and to read data from the SRAM cells. Very particular examples of a read and write operation for the particular circuit shown in FIGS. 2A to 3B will now be described.

In a write operation, a TCAM cell can first be placed into a "preset" state by a preset operation. In one approach, a preset operation can be performed in a first half of a cycle and can include a second word line (e.g., WLPST0) of a TCAM cell to which data is to be written being driven high. A second word line of a TCAM to which data is not to be written (e.g., WLPST1) can be remain low. In addition, floating PVss lines can be pre-discharged to a low value (e.g., Vss), which can result in a logic low value being written into both X and Y SRAM cells. In addition, write data can be driven on bit lines BLX_C and BLY_C. Because a first word line (e.g., WL0) remains low, such data is not yet written to the TCAM cell.

Following a preset operation, an actual writing of data can be performed. In one approach, an actual write operation can be performed in a second half of a cycle. In an actual write operation, a second word line (e.g., WLPST0) of a TCAM cell to which data is to be written can be driven low. A first word line (e.g., WL0) can be driven high, and data present on bit lines (BLX_C and BLY_C) can be written into X and Y SRAM cells.

In a read operation, data can be read from SRAM cells. In one approach, a read operation can be a two step operation that includes a precharge operation followed by an evaluation operation. A pre-charge operation can be performed in a first half cycle, while an evaluation operation can be performed in three subsequent half cycles.

In a pre-charge operation, a second word line of a TCAM cell from which data is to be read (e.g., WLPST0) can be driven low. This can isolate a corresponding stack portion from the SRAM. In addition, a first word line (e.g., WL0) of the cell being read can be low. Bit lines (BLX_C and BLY_C) can be pre-charged to high.

In an evaluation operation, in a second half cycle, the pre-charging of the bit lines (BLX_C and BLY_C) can stop and a second word line (e.g., WL0) can be driven high. In the next half cycle, because pass transistors connected to word line WL0 are turned on, a bit line (BLX_C and/or BLY_C) can be pulled low when data stored in a corresponding SRAM is low, or can be remain high when data stored in the corresponding SRAM is High. In a final or fourth half cycle, stored data values now present on bit lines (BLX_C and BLY_C) can be sensed by a sense amplifier (Sense Amp) in external circuitry (not shown).

Compare operations can be one-cycle operations that compare stored data with CD and BCD values provided to the stack portions. Based on data stored in X and Y SRAMs the following possible results can be sensed by a match sense amplifier:

A Miss—when external data doesn't match the encoded data (see above for encoding values) in X and Y SRAM cells—Match0 to PVss0 path is low impedance for at least one TCAM cell connected to the match line; or A Hit—when external data matches the encoded data (see above for encoding values) in X and Y SRAM cells—Match0 to PVss0 path is high impedance for all TCAM cells connected to the match line.

It is understood that both word lines of a TCAM cells (WLPST0/WL0 and WLPST1/WL1) are low during a compare operation, resulting in the bit lines being isolated from the SRAMs. Further, the PVss node of a stack is isolated from a corresponding SRAM cell by operation of the preset word line (WLPST0 or WLPST1) with internal nodes of the SRAMS being connected to the transistor gates of the corresponding stack.

In this way, interlocked TCAM cells, such as those shown in FIGS. 2A to 3B can execute compare, read and write operations.

It will be appreciated by those skilled in the art that there are many more possible schemes for a "compare operation" or "write operation" that can be performed by the pair of interlocked TCAM cells of the present invention, and the above is just one example.

In yet another embodiment, pairs of interlocking TCAM cells can be laid out in at least one of two ways within the same memory array. Two cell layout options are desirable in order to allow easy cell array creation. Such variations can be desirable due to the fact that the front-end layers (i.e., layers deposited toward the start of a integrated circuit manufacturing process) can be tiled in a Y direction and mirrored in an X direction, while back-end layers can be mostly tiled in both the X and Y directions. In such an approach, both options can be tiled in X direction with step of 2× width of a TCAM cell and tiled in Y direction with step height of a pair of TCAM cells.

Figure 4A:
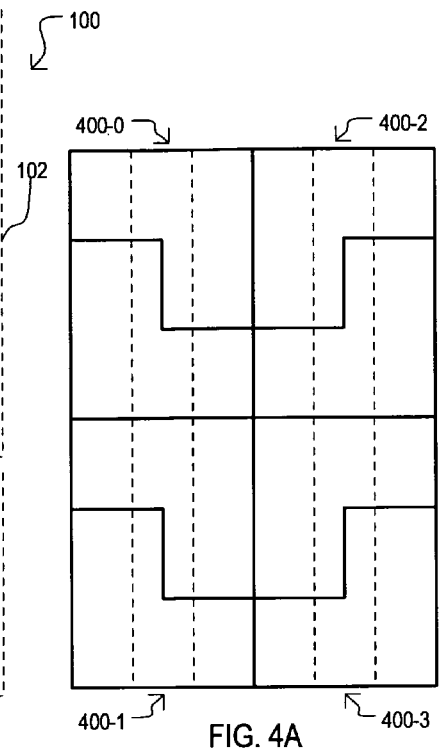
FIGS. 4A to 4C show two examples of interlocking TCAM cells repeated to form an array.
Figure 4B:
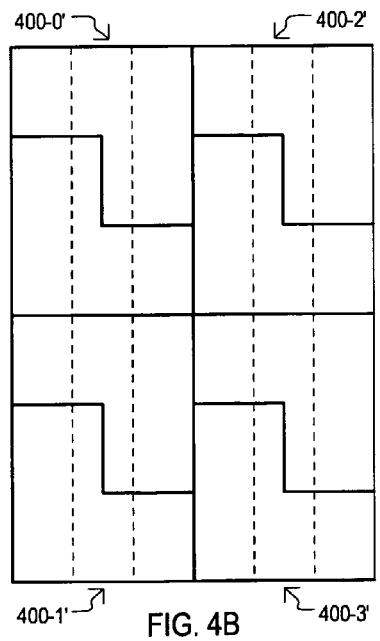

Two very particular examples of layout options are illustrated in FIGS. 4A and 4B. Both FIGS. 4A and 4B show a layout for four pairs of interlocked TCAM cells (400-0 to 400-3 and 400-0' to 400-3'). Each TCAM cell pair can take the form of the various embodiments described above. Thus, FIGS. 4A and 4B can be considered related to the previous embodiments.

Figure 4C:
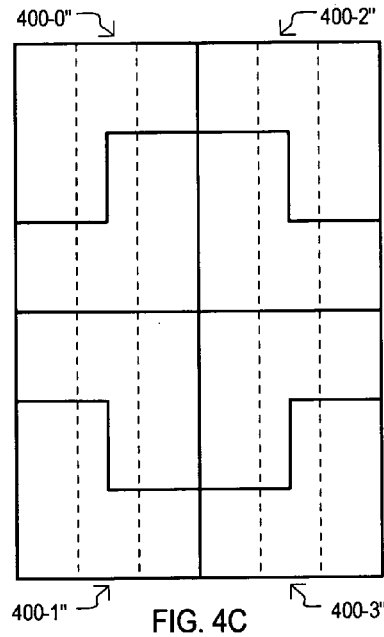

In FIG. 4A, a layout for a pair of TCAM cells can be tiled in the Y direction and mirrored in the X direction. In FIG. 4B, a layout for a pair of TCAM cells can be tiled in the Y direction and X direction. In FIG. 4C, a layout for a pair of TCAM cells can be mirrored in the Y direction. It is noted that in all such examples, TCAM cells adjacent to one another in the Y direction can advantageously share bit lines, if so desired.

Figure 5:
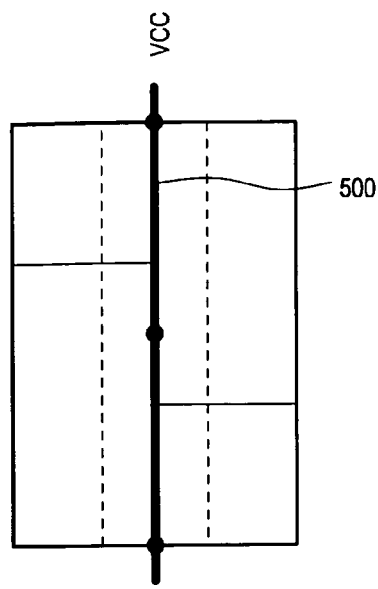
FIG. 5 shows an interconnect arrangement for a first power supply for interlocking TCAM cells according to an embodiment.
Figure 6:
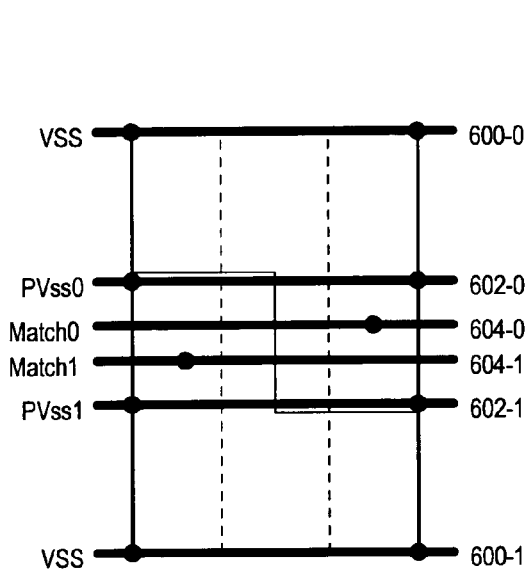
FIG. 6 shows an interconnect arrangement for a second power supply, a pseudo-power supply, and match lines for interlocking TCAM cells according to an embodiment.
Figure 7:
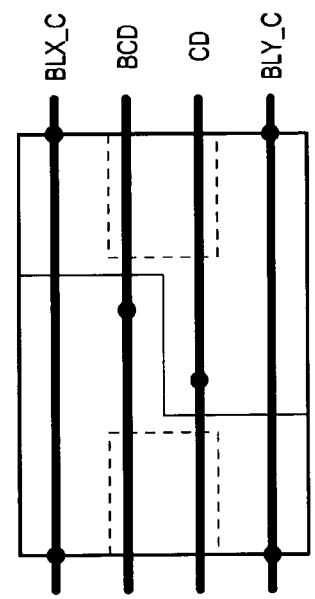
FIG. 7 shows an interconnect arrangement for bit lines and compare data for interlocking TCAM cells according to an embodiment.

Referring now to FIGS. 5 to 7, various signal connection arrangements for a pair of interlocked TCAM cells are shown in top plan views.

FIG. 5 shows one example of a high power supply voltage connection arrangement. A high power supply voltage VCC can be supplied via a VCC line 500 oriented perpendicular to word lines, and common to a column of TCAM cells (or columns of interlocked TCAM cell pairs). In one arrangement, such a first conductive layer can provide a high power supply VCC to memory cells as well as a to N-wells that hold P-channel transistors (provide a bias voltage to a "tap"). However, in alternate arrangements, such taps may not be needed, as a TCAM cell arrangement may have a body bias configuration. The arrangement of FIG. 5 can correspond to the second interconnect layer shown in FIG. 2B.

FIG. 6 shows a higher interconnect layer that can provide a low power supply VSS, pseudo-Vss (PVSS) nodes, and match lines for rows of TCAM cells. In one arrangement, VSS lines (600-0 and 600-1) can be shared by adjacent rows of TCAM cells. PVSS lines (602-0 and 602-1) and match lines 604-0 and 6041 can cross stack portions of each TCAM cell of an interlocked pair. In one very particular arrangement, the lines of FIG. 6 can be formed in a first layer of metallization and disposed in the row direction (i.e., parallel to the word lines).

FIG. 7 shows an interconnect layer that can provide a bit line connections and compare data values to TCAM cell pairs. In one arrangement, bit lines (BLX_C and BLY_C) and compare data lines (CD and BCD) can be formed in a second layer of metallization and all be disposed in the column direction (i.e., perpendicular to the word lines). One compare data line (CD) can cross over a stack portion of one TCAM cell, while another compare data line (BCD) can cross over a stack portion of the other TCAM cell.

While embodiments described above have shown interlocked memory/logic cells having an "L" shape, alternate embodiments can include different interlocking shapes for memory/logic cells. That is, various other shapes can present memory/logic pairs that share at least two sides. As but a few examples, an interlocked memory/logic cells can have a "T" shape, a "U" shape, an "S" shape or a "Z" shape.

Figure 8A:
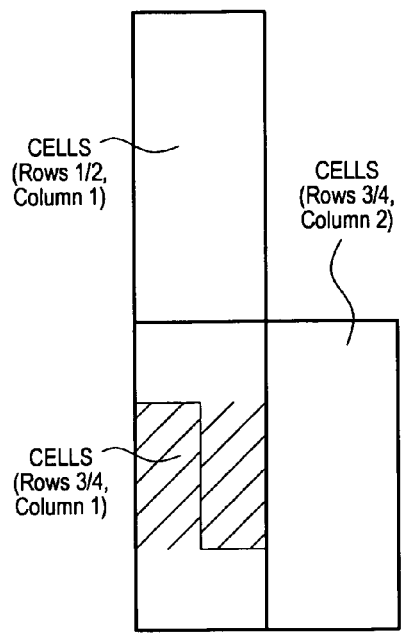
Figure 8B:
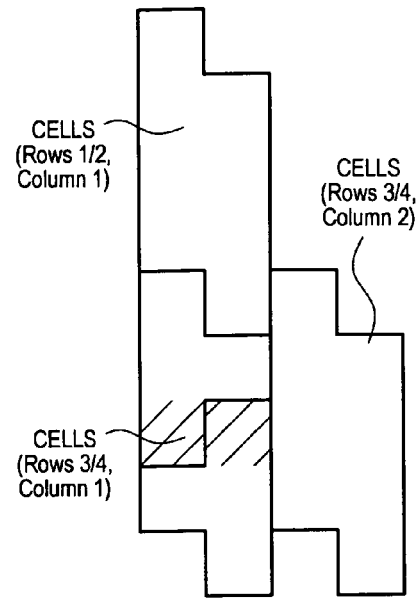
Figure 8C:
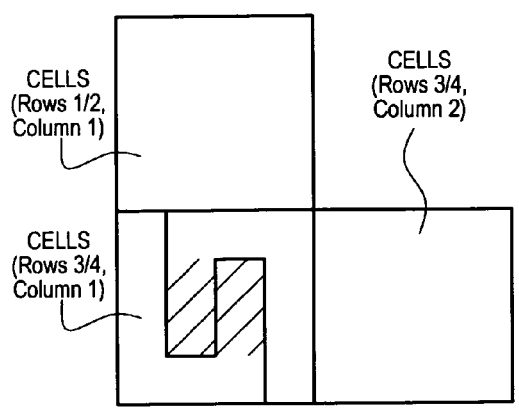
Figure 8D:
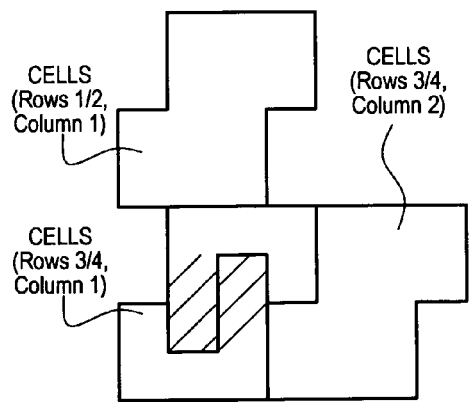

A few of the many possible examples of alternate shaped interlocking memory/logic cells are shown in FIGS. 8A to 8E. FIG. 8A shows one example of "L" shaped interlocked memory/logic cell pairs, like those described above. FIG. 8B shows one example of "T" shaped interlocked memory/logic cell pairs. FIGS. 8C and 8D shows two examples of "U" shaped interlocked memory/logic cell pairs. FIG. 8E shows one example of "Z" shaped interlocked memory/logic cell pairs. FIG. 8F shows one example of "S" shaped interlocked memory/logic cell pairs. Of course, one skilled in the art would recognize that numerous variations on such shapes are possible.

Each of FIGS. 8A to 8F has a hatched region. Such a hatched region indicates a location at which various connections can be advantageously placed. In particular, when utilized as a CAM cell that employs a pseudo-supply line (i.e., binary CAM, pseudo-TCAM, or TCAM), in such locations a pseudo-supply (e.g., pseudo-VSS) connection may be made from one CAM cell of one row to an adjacent CAM in the row above and/or below. Further or alternatively, compare data connections can be advantageously placed in such a hatched region.

In this way, memory/logic cells having shapes other than an "L" shape can be interlocked with one another to form compact repeatable structures for building a memory/logic array.

Referring now to FIGS. 9A and 9B, different biasing schemes for an N-type substrate region of interlocked memory/logic cell pairs is shown in cross section. Such biasing arrangements can be utilized in any of the above embodiments, thus FIGS. 9A and 9B can be considered related to the above embodiments.

FIG. 9A is a side cross sectional view of a portion of a memory/logic cell 900. FIG. 9A shows a P-type substrate 902 in which is formed an N-type well 904. A high power supply voltage VCC can be provided to a source of a P-channel transistor 906 within N-type well 904 (which may form part of an SRAM latch). In addition, a high power supply voltage VCC can be provided to bias N-type well 904 by way of a "tap" 908.

FIG. 9B is a side cross sectional view of a portion of a memory/logic cell 950 according to another embodiment having a triple well arrangement. FIG. 9B shows a P-type substrate 952 in which is formed an N-type well 954. A P-type well 956 is formed within an N-type well 954. An entire N-type well 954 can be biased to a voltage $V_{PB}$ via a bias source 960. Consequently, a P-channel transistor 958 can have a body bias type connection. One skilled in the art would recognize that such an arrangement can eliminate the need for a "tap", as in the case of FIG. 9A, if desired.

In this way, interlocked memory/logic cells according to the various embodiments can be manufactured according to CMOS type circuits configured with tapped wells as well as those with a body bias voltage.

Referring now to FIGS. 10A to 10D, a method of manufacturing interlocked TCAM cells will now be described with a series of top plan views. The view and particular layers can correspond to those shown in FIGS. 2A and 2B.

Figure 10A:
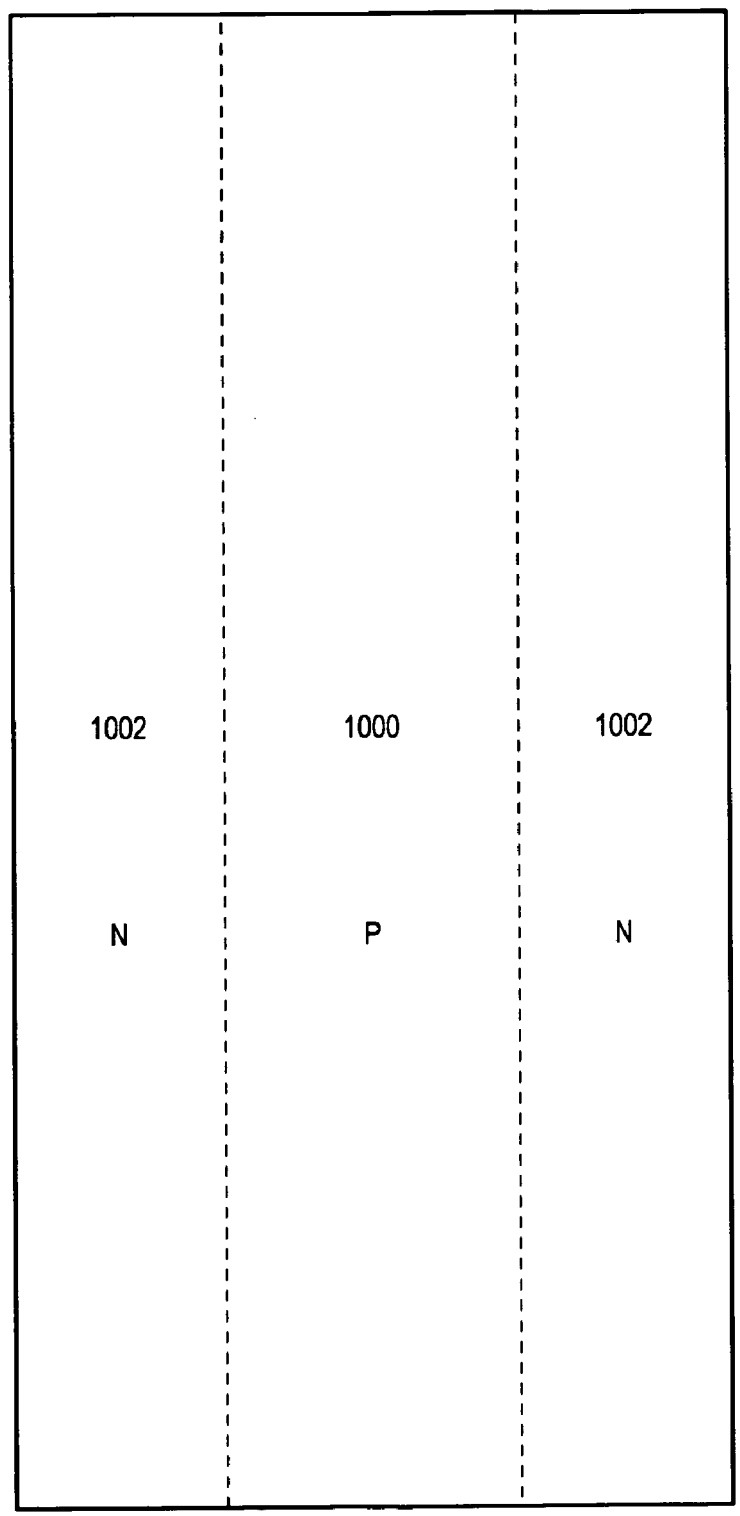
FIGS. 10A to 10D show a method of manufacturing the interlocking TCAM cells shown in FIGS. 2A and 2B.

As shown in FIG. 10A, an N-type region 1000 and P-type regions 1002 can be formed in a substrate according to well understood techniques. However, as noted previously, such regions can be formed in parallel strips arranged in the same first direction (in this case, vertically). Even more particularly, an N-type region 1000 can be formed between adjacent P-type regions 1002.

In one approach, an N-type region 1000 can be a well, while P-type regions 1002 can be a P-type substrate containing such a well. In alternate arrangement, an N-type region 1000 can be an N-well, while P-type regions 1002 can be P-wells formed within such an N-well.

Figure 10B:
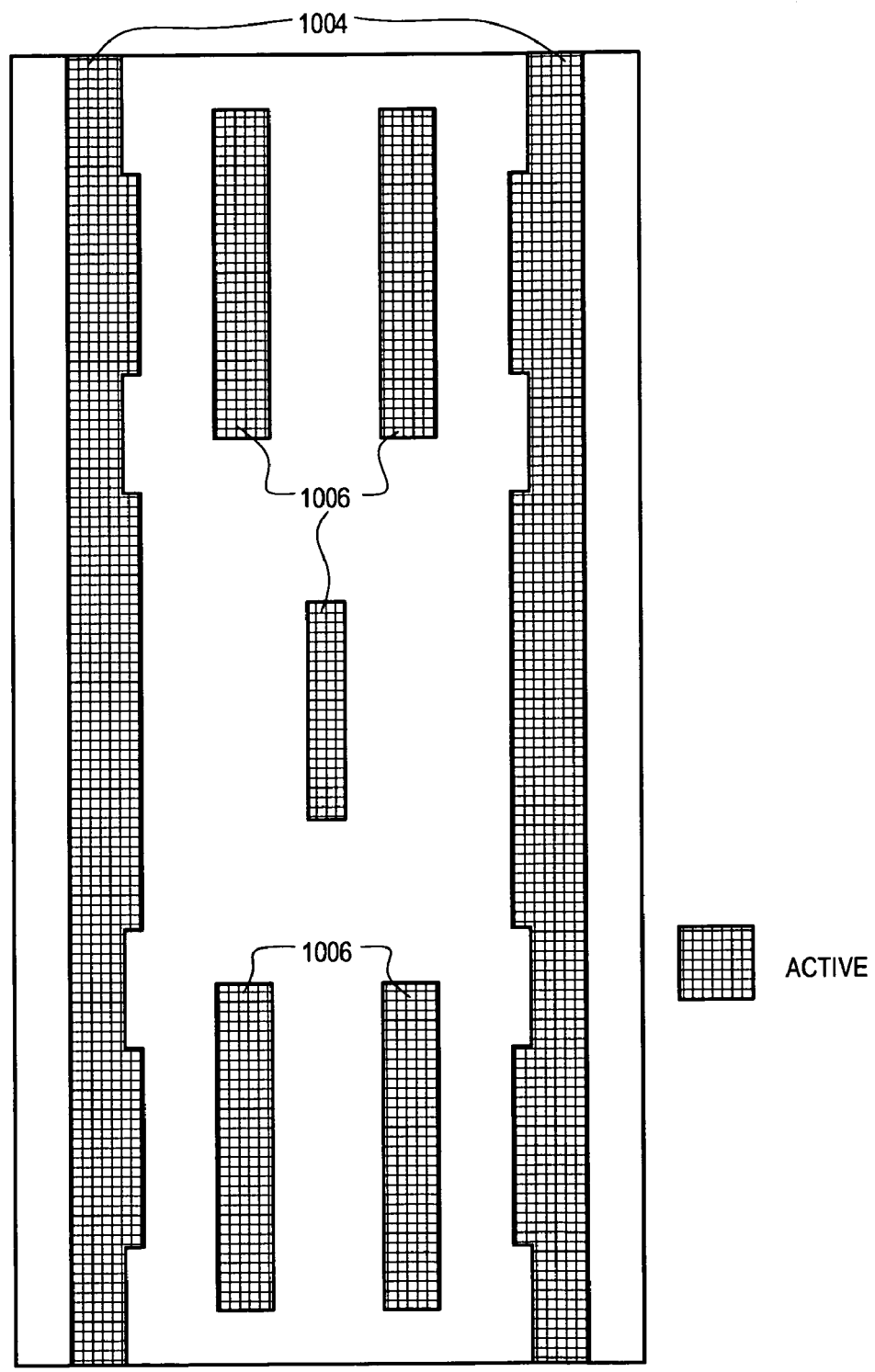

Referring now to FIG. 10B, active regions can be formed in the substrate according to well understood techniques, including but not limited to isolation, threshold voltage implant and the formation of a gate oxide. Unlike some conventional approaches, however, N-type active regions 1004 and P-type active regions 1006 can be arranged in parallel with one another in the first direction. Even more particularly, P-type active regions 1006 can be situated between contiguous N-type regions 1004.

It is noted that while FIG. 10B shows a centrally located tap, such a tap can be omitted in a body biased arrangement.

Figure 10C:
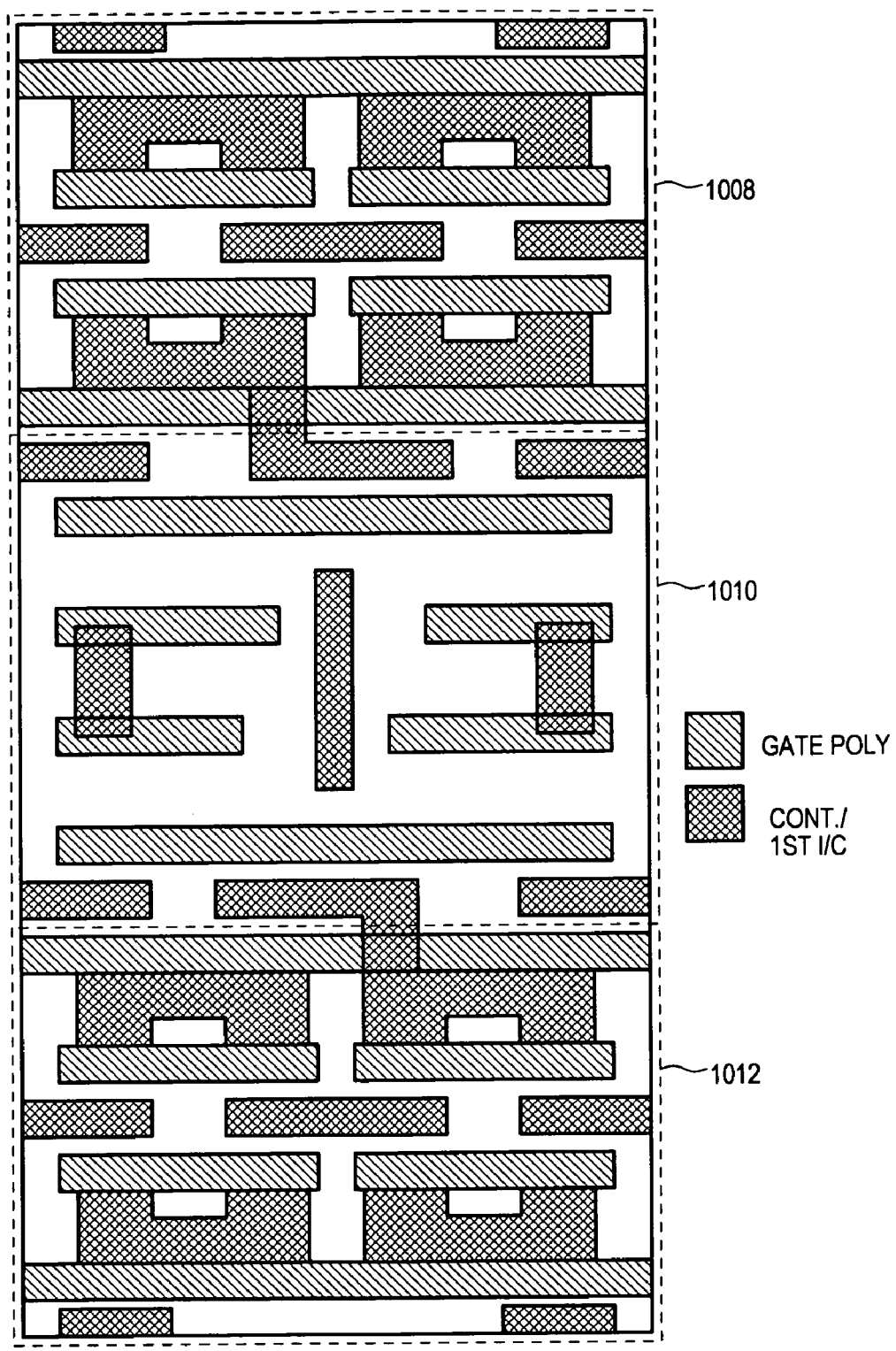

Referring now to FIG. 10C, transistor gate structures can be formed in conjunction with active regions in order to form transistors. Such patterning can be according to conventional deposition, lithography and etch techniques. In one very particular arrangement, such gates structures can be formed from polysilicon. Source and drain regions can be formed by conventional implant and/or diffusion techniques.

In one arrangement, gate structures can be situated in a second direction that is essentially perpendicular to a first direction. Still further, particular gate structures can be formed to create transistors in a first region 1008 for SRAMs of a first TCAM cell, a second region 1010 for transistors of stack portions for both a first and second TCAM cell, and a third region 1012 for SRAMs of a second TCAM cell.

A first interlayer dielectric can then be formed over the gate structures according to conventional techniques. Contacts can be formed through such an interlayer dielectric, and a first interconnect layer ($1^{st}$ I/C) can be formed. A first interconnect layer can be formed according to damascene techniques. A second dielectric layer can then be formed over the first interconnect layer.

Figure 10D:
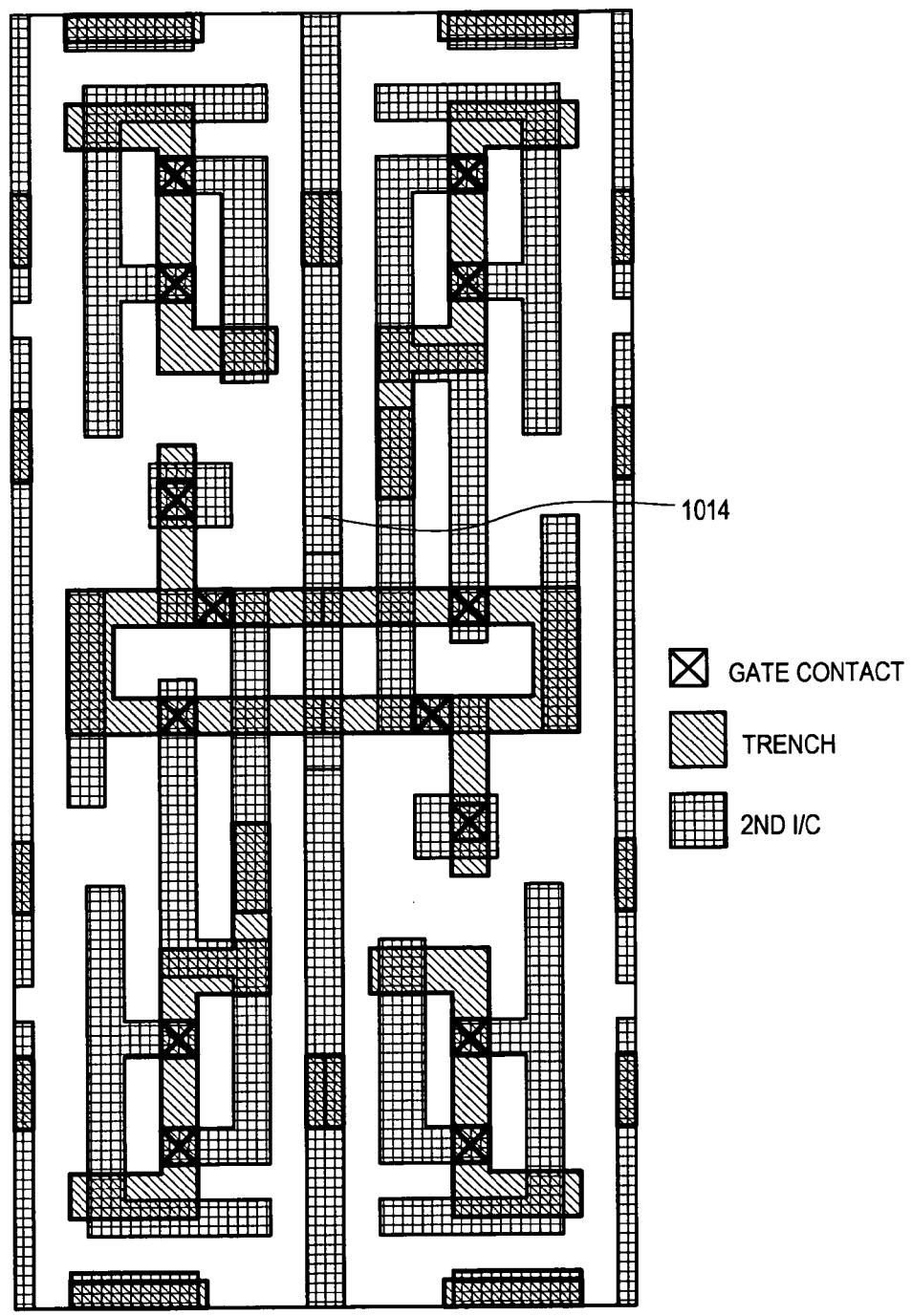

Referring now to FIG. 10D, trenches can be formed through a second dielectric layer to expose portions of gate contacts and first interconnects. A second interconnect layer can be formed according to conventional techniques. It is understood that in FIG. 10D, contact/vias are formed where a second interconnect layer intersects a trench. Preferably, a second interconnect layer can be formed with dual damascene techniques. As shown in FIG. 10D, in one particular approach, such a layer can include a VCC line 1014 situated in the first direction.

Higher level interconnections can be made according various approaches, including but not limited to those shown in FIGS. 5-7.

It is noted that while various above embodiments have shown CAM arrangements that utilize a NOR type compare circuit, the present invention should not be construed as being limited to any particular compare circuitry. As but one alternate arrangement, a CAM implementation can include NAND type compare arrangements, in which CAM rows provide a serial-like NAND compare operation to arrive at a match result. A very particular NAND arrangement is shown in FIGS. 12 and 13.

Figure 12:
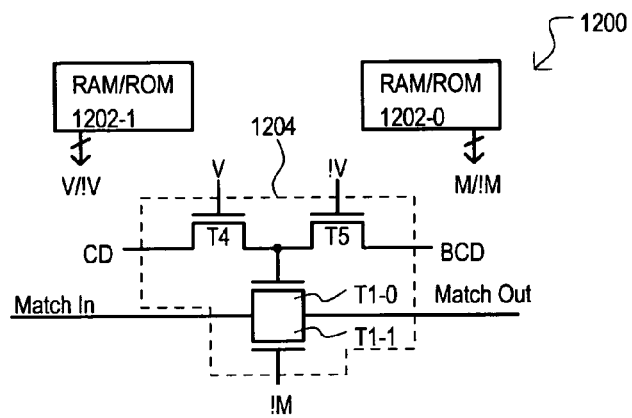
FIG. 12 is a schematic diagram showing a NAND type TCAM cell that can be included in the embodiments of the present invention.

FIG. 12 is a schematic diagram showing one example of a NAND CAM cell arrangement. While a ternary NAND CAM cell is shown, a binary NAND CAM cell could also be employed. In the NAND CAM cell, a passgate transistor T1-0 can be enabled/disabled according to a compare result generated by transistors T4 and T5, or a parallel passgate transistor T1-1 can be enabled/disabled according to a mask value.

Figure 13:
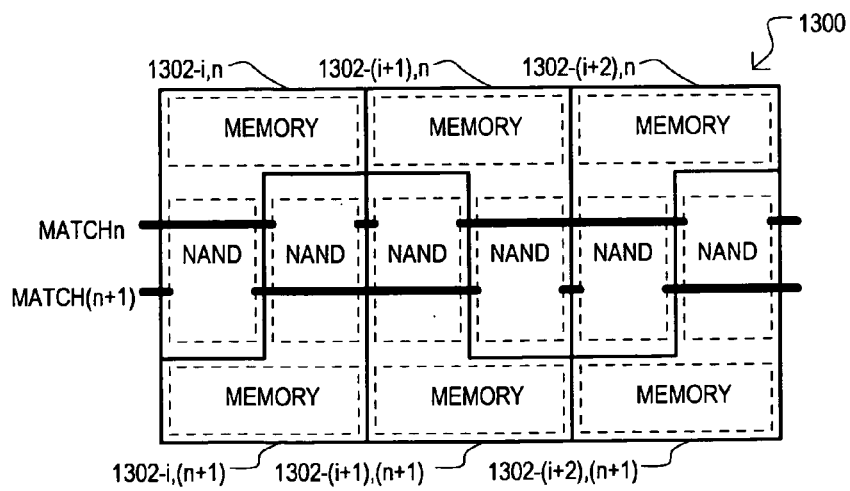
FIG. 13 is a top plan view showing NAND type CAM device layout according to one embodiment.

FIG. 13 shows interlocked NAND type CAM cells. CAM cells of one row can provide a match path (MATCHn or MATCH(n+1)) that may be pulled high in match case.

The various embodiments disclosed may have advantages over previous or conventional TCAM cells layouts, including any of: (i) area reduction of up to about 24% in the size of the TCAM memory array; (ii) speed improvement over other (XY) TCAM architectures; (iii) "Body Bias" compatibility (when tap removed from the TCAM cell and tapping cells are used outside of the TCAM cell); (iv) ability to utilize existing embedded SRAM cell architectures, i.e., a double-word line 6T SRAM cell; and (v) compatibility with dual damascene local interconnect processes. Of course, embodiments of the present invention may exist without such advantages. In addition, the invention is subject to considerable variations, and so can provide other advantages that those described above.

It will be appreciated by those skilled in the art that in CAM type implementations there are many more possible schemes for a "compare operation" that can be performed by the pair of interlocked CAM cells, including but not limited to binary compare operations, pseudo-ternary compare operations, full value/mask (V/M) ternary compare operations, as well as X/Y encoded compare operations, as described above.

Along these same lines, while a memory/logic cells have been described above as SRAM type memory cells, alternate arrangements could include different types of memory cells, including but not limited to dynamic RAM cells, as well as non-volatile memory cells, such as magneto-resistive RAM (MRAM) cells, ferro-electric RAM (FRAM) cells, programmable read only memory (PROM) cells, electrical PROM (EPROM) cells, and electrically erasable PROM (EEPROM) cells.

It is also understood that the embodiments of the invention may be practiced in the absence of an element and or step not specifically disclosed. That is, an inventive feature of the invention can be elimination of an element.

The foregoing description of specific embodiments and examples of the invention have been presented for the purpose of illustration and description, and although the invention has been described and illustrated by certain of the preceding examples, it is not to be construed as being limited thereby. They are not intended to be exhaustive or to limit the invention to the precise forms disclosed, and many modifications, improvements and variations within the scope of the invention are possible in light of the above teaching. It is intended that the scope of the invention encompass the generic area as herein disclosed, and by the claims appended hereto and their equivalents.

What is claimed is:

1. A configuration for memory/logic cells, comprising:
a first memory/logic cell having at least a first memory cell with at least one pass transistor and a first logic section coupled between a first pseudo-supply node that is selectively isolated from a power supply and a first match line; and
a second memory/logic cell having at least a second memory cell with at least one pass transistor and a second logic section coupled between a second pseudo-supply node that is selectively isolated from the power supply and a second match line; wherein
the at least one pass transistor of the at least first memory cell is coupled to the second pseudo-supply node.

2. The configuration of claim 1, wherein:
the first and second logic sections each include a plurality of transistors physically arranged in series with one another to form at least one stack.

3. The configuration of claim 2, wherein:
the plurality of transistors comprise n-channel insulated gate field effect transistors.

4. The configuration of claim 2, wherein:
the plurality of transistors form a first stack in parallel with a second stack, at least a first transistor of the first stack having a gate coupled to the first memory cell and at least a first transistor of the second stack having a gate coupled to the second memory cell.

5. The configuration of claim 4, further including:
a first and second data line arranged in parallel with and formed over the first and second stacks;
at least a second transistor in the first stack and at least a second transistor in the second stack having gates coupled to the first data line, and
at least a third transistor in the first stack and at least a third transistor in the second stack having gates coupled to the second data line.

6. The configuration of claim 2, further including:
the plurality of transistors form a first stack in parallel with a second stack; and
a first and second pseudo-supply line arranged essentially perpendicular to and formed over the first and second stacks, the first pseudo-supply line being coupled to at least one transistor of the first stack, and the second pseudo-supply line being coupled to at least one transistor of the second stack.

7. The configuration of claim 2, further including:
the plurality of transistors form a first stack in parallel with a second stack; and
a first and second match line arranged essentially perpendicular to and formed over the first and second stacks, the first match line being coupled to the first stack, and the second match line being coupled to the second stack.

8. The configuration of claim 2, further including:
the first memory/logic cell comprises a first latch and a second latch; and
a first power supply line formed over and essentially parallel to the at least one stack, the first power supply line being commonly coupled to the first and second latch at a single node.

9. The configuration of claim 8, further including:

the second memory/logic cell comprises a third latch and a fourth latch;

the first power supply line is commonly coupled to the third and fourth latch at a single node;

a second power supply line essentially parallel to the first power supply line commonly coupled to the first and third latches; and a third power supply line formed over and essentially parallel to the first power supply line, the third power supply line being commonly coupled to the second and fourth latches; wherein the second and third power supply lines provide a different power supply voltage than the first power supply line.

10. The configuration of claim 1, wherein:

the at least one pass transistor of the at least second memory cell is coupled to the first pseudo-supply node.

11. The configuration of claim 1, further including:

the first memory/logic cell is formed in one row of an array of memory/logic cells; and the second memory/logic cell is formed in another row of the array that is adjacent to the one row.

12. The configuration of claim 1, wherein:

the first memory/logic cell comprises a first latch and a second latch that each store data values on complementary logic nodes, one logic node of the first and second latch being accessed by a first word line, the other logic node of the first latch being coupled to the second pseudo-supply node in response to a first preset word line, and the other logic node of the second latch being coupled to the first pseudo-supply node in response to the first preset word line.

13. The configuration of claim 12, wherein:

the second memory/logic cell comprises a third latch and a fourth latch that each store data values on complementary logic nodes, one logic node of the third and fourth latch being accessed by a second word line, the other logic node of the third latch being coupled to the second pseudo-supply node in response to a second preset word line, and the other logic node of the fourth latch being coupled to the first pseudo-supply node in response to the second preset word line.

* * * * *

UNITED STATES PATENT AND TRADEMARK OFFICE
CERTIFICATE OF CORRECTION

| | |
|---|---|
| PATENT NO. | : 7,277,309 B1 |
| APPLICATION NO. | : 11/585460 |
| DATED | : October 2, 2007 |
| INVENTOR(S) | : Bartosz Banachowicz and Andrew Wright |

Page 1 of 1

It is certified that error appears in the above-identified patent and that said Letters Patent is hereby corrected as shown below:

At column 7, line 9, please replace "2140" with -- 214-0 -- so that the corresponding phrase reads -- (e.g., 214-0 and 214-1) --.

Signed and Sealed this

Twenty-second Day of July, 2008

JON W. DUDAS
*Director of the United States Patent and Trademark Office*